United States Patent
Honda et al.

(10) Patent No.: US 8,158,535 B2
(45) Date of Patent: Apr. 17, 2012

(54) METHOD FOR FORMING INSULATING FILM AND METHOD FOR MANUFACTURING SEMICONDUCTOR DEVICE

(75) Inventors: Minoru Honda, Amagasaki (JP); Yoshihiro Sato, Amagasaki (JP); Toshio Nakanishi, Amagasaki (JP)

(73) Assignee: Tokyo Electron Limited, Tokyo (JP)

( * ) Notice: Subject to any disclaimer, the term of this patent is extended or adjusted under 35 U.S.C. 154(b) by 151 days.

(21) Appl. No.: 12/521,666

(22) PCT Filed: Dec. 20, 2007

(86) PCT No.: PCT/JP2007/074483
§ 371 (c)(1),
(2), (4) Date: Aug. 21, 2009

(87) PCT Pub. No.: WO2008/081724
PCT Pub. Date: Jul. 10, 2008

(65) Prior Publication Data
US 2010/0323531 A1    Dec. 23, 2010

(30) Foreign Application Priority Data
Dec. 28, 2006   (JP) .................................. 2006-356084

(51) Int. Cl.
*H01L 21/31* (2006.01)
(52) U.S. Cl. .. 438/770; 438/775; 438/786; 257/E21.267
(58) Field of Classification Search ............ 438/769, 438/770, 775, 786; 257/E21.267; 118/697, 118/723 AN
See application file for complete search history.

(56) References Cited

U.S. PATENT DOCUMENTS

| | | | |
|---|---|---|---|
| 6,548,366 B2 * | 4/2003 | Niimi et al. | 438/384 |
| 6,933,248 B2 | 8/2005 | Grider | |
| 7,517,751 B2 * | 4/2009 | Sugawara et al. | 438/240 |
| 2002/0030213 A1 * | 3/2002 | Yoshida et al. | 257/300 |
| 2004/0101997 A1 * | 5/2004 | Maekawa et al. | 438/151 |
| 2004/0175961 A1 * | 9/2004 | Olsen | 438/786 |
| 2005/0064667 A1 | 3/2005 | Matsushita et al. | |
| 2005/0164523 A1 * | 7/2005 | Sugawara et al. | 438/791 |
| 2006/0234515 A1 * | 10/2006 | Aoyama et al. | 438/758 |
| 2007/0059944 A1 | 3/2007 | Matsuyama et al. | |
| 2007/0212895 A1 * | 9/2007 | Chua et al. | 438/758 |

FOREIGN PATENT DOCUMENTS

| | | |
|---|---|---|
| JP | 2001 274148 | 10/2001 |
| JP | 2002 198531 | 7/2002 |
| JP | 2003 78132 | 3/2003 |
| JP | 2005 93865 | 4/2005 |
| WO | 2005 086215 | 9/2005 |

* cited by examiner

*Primary Examiner* — Tuan N. Quach
(74) *Attorney, Agent, or Firm* — Oblon, Spivak, McClelland, Maier & Neustadt, L.L.P.

(57) ABSTRACT

A method for forming an insulating film includes a step of preparing a substrate, which is to be processed and has silicon exposed on the surface, a step of performing oxidizing to the silicon on the surface, and forming a silicon oxide thin film on the surface of the silicon, a step of performing first nitriding to the silicon oxide film and the base silicon thereof, and forming a silicon oxynitride film, and a step of performing first heat treatment to the silicon oxynitride film in $N_2O$ atmosphere. In such method, a step of performing second nitriding to the silicon oxynitride film may be further included after the first heat treatment, and furthermore, a step of performing second heat treatment to the silicon oxynitride film after the second nitriding may be included.

14 Claims, 11 Drawing Sheets

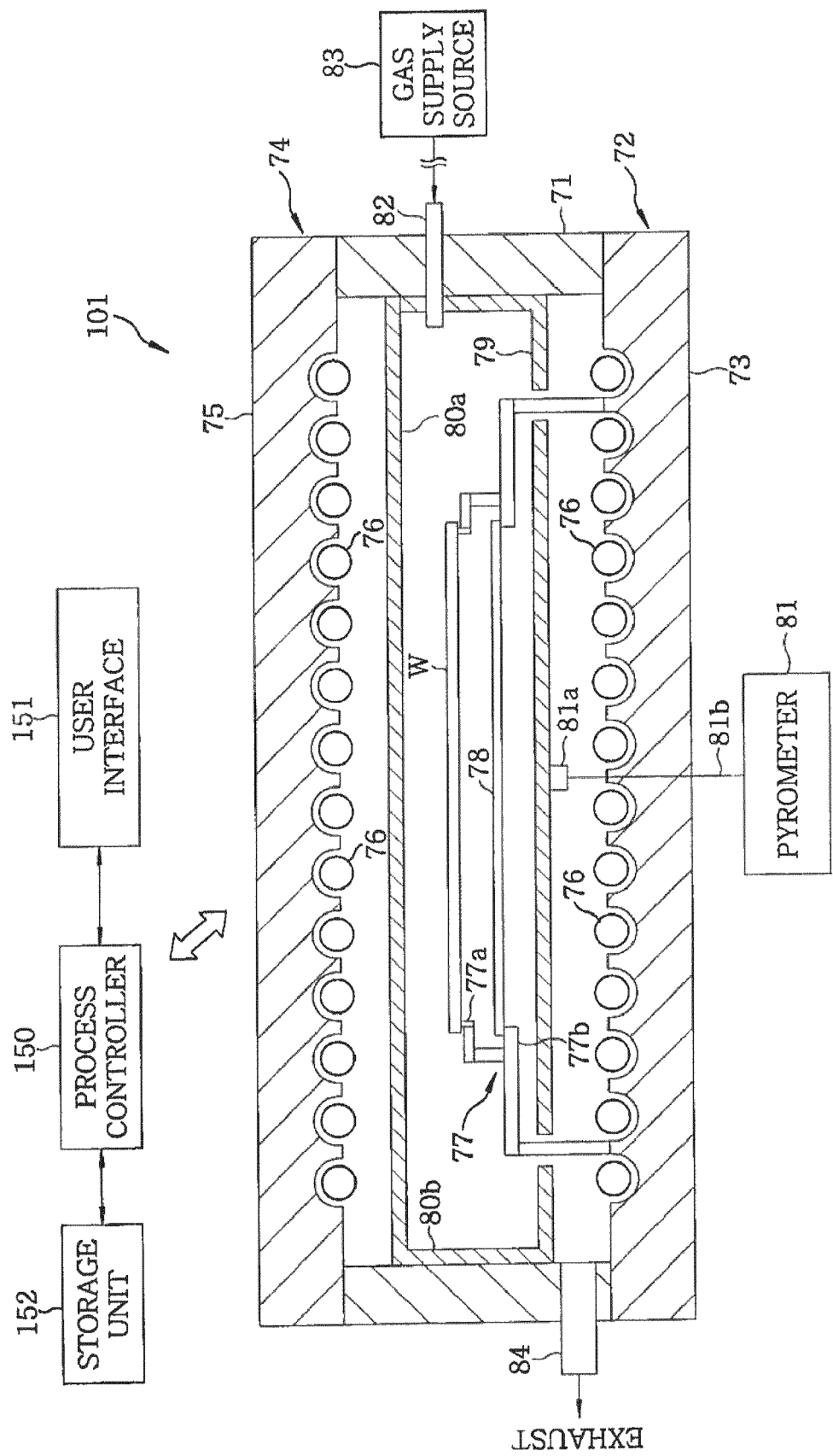

FIG. 12
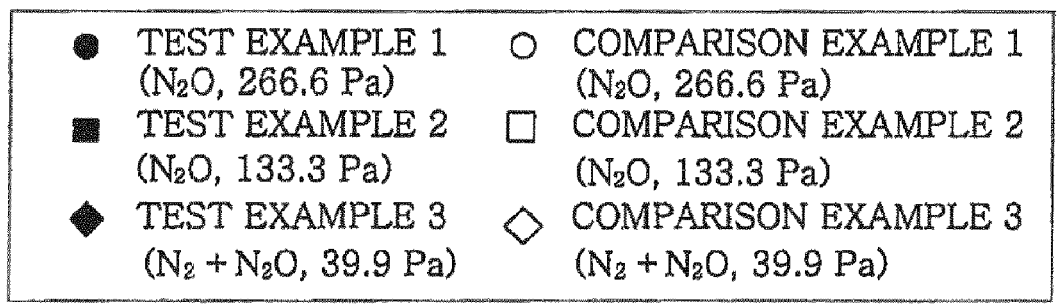
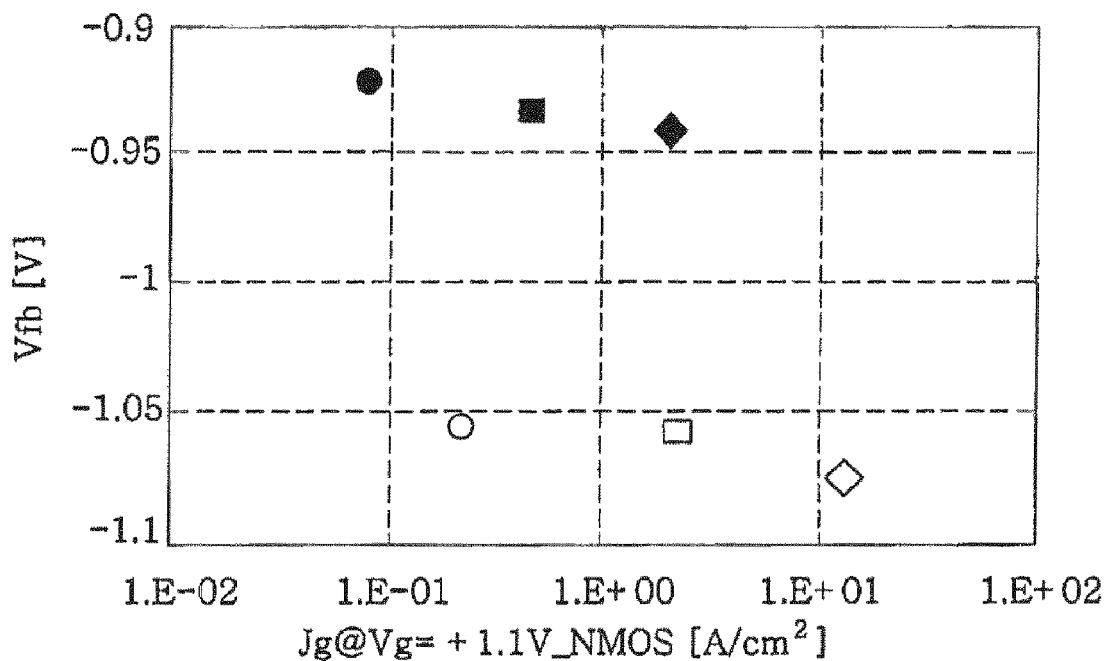

METHOD FOR FORMING INSULATING FILM AND METHOD FOR MANUFACTURING SEMICONDUCTOR DEVICE

FIELD OF THE INVENTION

The present invention relates to a method for forming an insulating film on a substrate to be processed, such as a semiconductor substrate, and a method for manufacturing a semiconductor device including a process of forming the insulating film thereby.

BACKGROUND OF THE INVENTION

In a process of manufacturing various semiconductor devices, a silicon nitride film is formed as, e.g., a gate insulating film of a transistor. In order to form such a silicon nitride film, in addition to a method of depositing a silicon nitride film by chemical vapor deposition (CVD), for example, a method of forming a silicon oxynitride film by introducing nitrogen into a silicon oxide film through a plasma process has been proposed (see, e.g., Japanese Patent Laid-open Publication No. 2001-274148: Patent Document 1).

Recently, as the gate insulating film becomes increasingly thinner in association with miniaturization of a semiconductor device, formation of a thin gate insulating film having a film thickness of several nm is required. On this account, formation of a silicon nitride film through direct nitriding of silicon has been actively studied.

As a method for forming a gate insulating film by introducing nitrogen directly to a silicon substrate, there is proposed a method for forming the gate insulating film, wherein the method includes a step of forming a first nitride film on the semiconductor substrate, a step of forming a first oxide layer between the semiconductor substrate and the first nitride film as well as simultaneously forming a second oxide layer on the first nitride film, and a step of forming a second nitride film or an oxynitride film on the first nitride film by carrying out nitriding of the second oxide layer, in order to render uniform the film thickness of the gate insulating film to reduce an equivalent oxide thickness (EOT) (see, e.g., Japanese Patent Laid-open Publication No. 2005-93865: Patent Document 2).

In the above method of Patent Document 2, the silicon nitride film is formed by carrying out direct nitriding of the silicon substrate. Then, oxidation and nitriding are performed to thereby form the silicon oxide layer, the first silicon nitride film, and the second silicon nitride film (or the silicon oxynitride film) on the interface of the silicon substrate.

However, in case of the gate insulating film formed by the method disclosed in Patent Document 2, due to interface states and fixed charges being developed, threshold voltage is varied and flat band voltage (Vfb) is increased, thereby negatively influencing upon mobility of electrons or holes in a transistor. In accordance with the method of Patent Document 2, it is difficult to form a gate insulating film having excellent electrical characteristics and high reliability on the transistor.

SUMMARY OF THE INVENTION

It is an object of the present invention to provide a method of forming an insulating film, in which a high quality thin insulating film is formed by carrying out nitriding of silicon.

It is another object of the present invention to provide a method of manufacturing a semiconductor device including the above insulating film forming method.

In accordance with a first aspect of the present invention, there is provided a method for forming an insulating film, comprising: preparing a substrate to be processed, in which silicon is exposed on a surface of the substrate; performing an oxidation process on the silicon to form a thin silicon oxide film on a surface of the silicon; performing a first nitriding process on the silicon oxide film and the silicon provided under the silicon oxide film to form a silicon oxynitride film; and performing a first thermal process on the silicon oxynitride film in an $N_2O$ atmosphere.

In the first aspect, the method may further include performing a second nitriding process on the silicon oxynitride film, after the first thermal process is performed. The method may further include performing a second thermal process on the silicon oxynitride film, after the second nitriding process is performed.

In the first aspect, in the oxidation process of the silicon, the silicon oxide film having a film thickness ranging from 0.2 to 1 nm may be formed. In this case, the oxidation process of the silicon may be performed by using any one method of chemical surface treatment, ultraviolet ray irradiation, plasma oxidation, and rapid thermal oxidation. In the chemical surface treatment, the silicon oxide film having a film thickness ranging from 0.2 to 0.8 nm may be formed.

The first thermal process may be performed at a temperature ranging from 1,000 to 1,200° C. The first nitriding process may be performed by using a plasma of rare gas and gas containing nitrogen. The second nitriding process may be performed by using a plasma of rare gas and gas containing nitrogen.

The first nitriding process may be performed by using a plasma containing nitrogen formed by introducing a microwave into a process chamber through a planar antenna having a plurality of slots. The first nitriding process may be performed by interposing a dielectric plate having a plurality of through holes between the substrate placed in the process chamber and a plasma generating region.

The first thermal process may be performed in an atmosphere of a gaseous mixture containing $N_2O$ and $N_2$ or an $N_2O$ gas atmosphere. In this case, a process pressure may range from 133.3 to 1,333 Pa, and a process temperature may range from 900 to 1,200° C.

The second thermal process may be performed in an $N_2$ gas atmosphere, an $O_2$ gas atmosphere, or an atmosphere of a gaseous mixture containing $N_2$ and $O_2$. In this case, a process pressure may range from 133.3 to 1,333 Pa, and a process temperature may range from 800 to 1,200° C.

The method may further include performing a surface activation process on the substrate with a solution containing dilute hydrofluoric acid, before the oxidation process of the silicon is performed.

In accordance with a second aspect of the present invention, there is provided a method of manufacturing a semiconductor device, comprising: forming an insulating film including preparing a substrate to be processed, in which silicon is exposed on a surface of the substrate, performing an oxidation process on the silicon to form a thin silicon oxide film on a surface of the silicon, performing a nitriding process on the silicon oxide film and the silicon provided under the silicon oxide film to form a silicon oxynitride film, and performing a thermal process on the silicon oxynitride film in an $N_2O$ atmosphere; and forming semiconductor device elements on the substrate.

In accordance with a third aspect of the present invention, there is provided a storage medium, storing a program which runs on a computer and, when executed, controls a substrate processing system including an oxidation unit, a nitriding unit and a heat treating unit to perform a method for forming an insulating film, the method comprising: preparing a substrate to be processed, in which silicon is exposed from the surface of the substrate; performing an oxidation process on the silicon to form a thin silicon oxide film on the silicon surface; performing a nitriding process on the silicon oxide film and the silicon provided under the silicon oxide film to form a silicon oxynitride film; and performing a thermal process on the silicon oxynitride film in an $N_2O$ atmosphere.

In accordance with a fourth aspect of the present invention, there is provided a substrate processing system comprising: an oxidation unit for performing an oxidation process on a substrate to be processed; a nitriding unit for performing a nitriding process on the substrate; a heat treating unit for performing a thermal process on the substrate; and a controller for controlling the oxidation unit, the nitriding unit and the heat treating unit such that the oxidation process is performed on silicon of the substrate, in which the silicon is exposed on a surface of the substrate, to form a thin silicon oxide film on a surface of the silicon, the nitriding process is performed on the silicon oxide film and the silicon provided under the silicon oxide film to form a silicon oxynitride film, and the thermal process is performed on the silicon oxynitride film in an $N_2O$ atmosphere.

In accordance with the aspects of the present invention, by performing an oxidation process upon silicon of the surface of a substrate to be processed to form a thin silicon oxide film on the silicon surface, performing a nitriding process on the silicon oxide film and the silicon provided under the silicon oxide film to form a silicon oxynitride film, and performing a thermal process on the silicon oxynitride film in an $N_2O$ atmosphere, fixed charges in the silicon oxynitride film are reduced, and when the silicon oxynitride film is used as a gate insulating film of a transistor, flat band voltage (Vfd) is suppressed to a small value and high on current (Ion) is obtained.

That is, by forming the thin silicon oxide film on the silicon surface in the oxidation process prior to the nitriding process, a nitrogen concentration at the silicon interface is lowered, and thus the flat band voltage (Vfd) of the transistor is suppressed and the on current (Ion) is improved.

Further, when the nitriding of the silicon oxynitride film is carried out after the thermal process, leakage current is reduced by increasing a nitrogen concentration near the surface of the silicon oxynitride film.

Therefore, when the insulating film formed by the method in accordance with the present invention is used as a gate insulating film of a transistor, the gate insulating film has excellent electrical characteristics. Accordingly, the method in accordance with the present invention is advantageously used in the formation of a thin gate insulating film having a film thickness less than 1 nm in a process of manufacturing a semiconductor device, thereby facilitating miniaturization thereof.

BRIEF DESCRIPTION OF THE DRAWINGS

FIG. 9 schematically illustrates a cross sectional view showing one example of a heat treating unit used in the substrate processing system shown in FIG. 4.

FIG. 12 is a graph illustrating a relationship between gate leakage currents (Jg) and flat band voltages (Vfb) of the silicon nitride films.

DETAILED DESCRIPTION OF THE EMBODIMENTS

Hereinafter, embodiments of the present invention will be described in detail with reference to the accompanying drawings.

Figure 1:
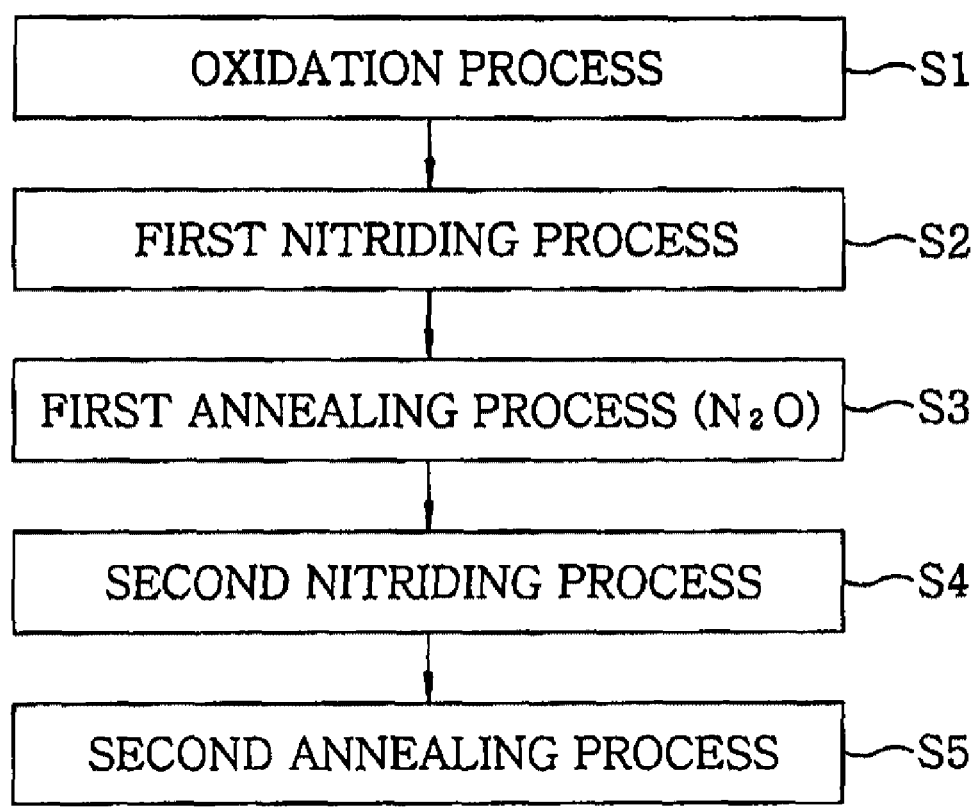
FIG. 1 is a flowchart illustrating a method of forming an insulating film in accordance with an embodiment of the present invention.
Figure 2:
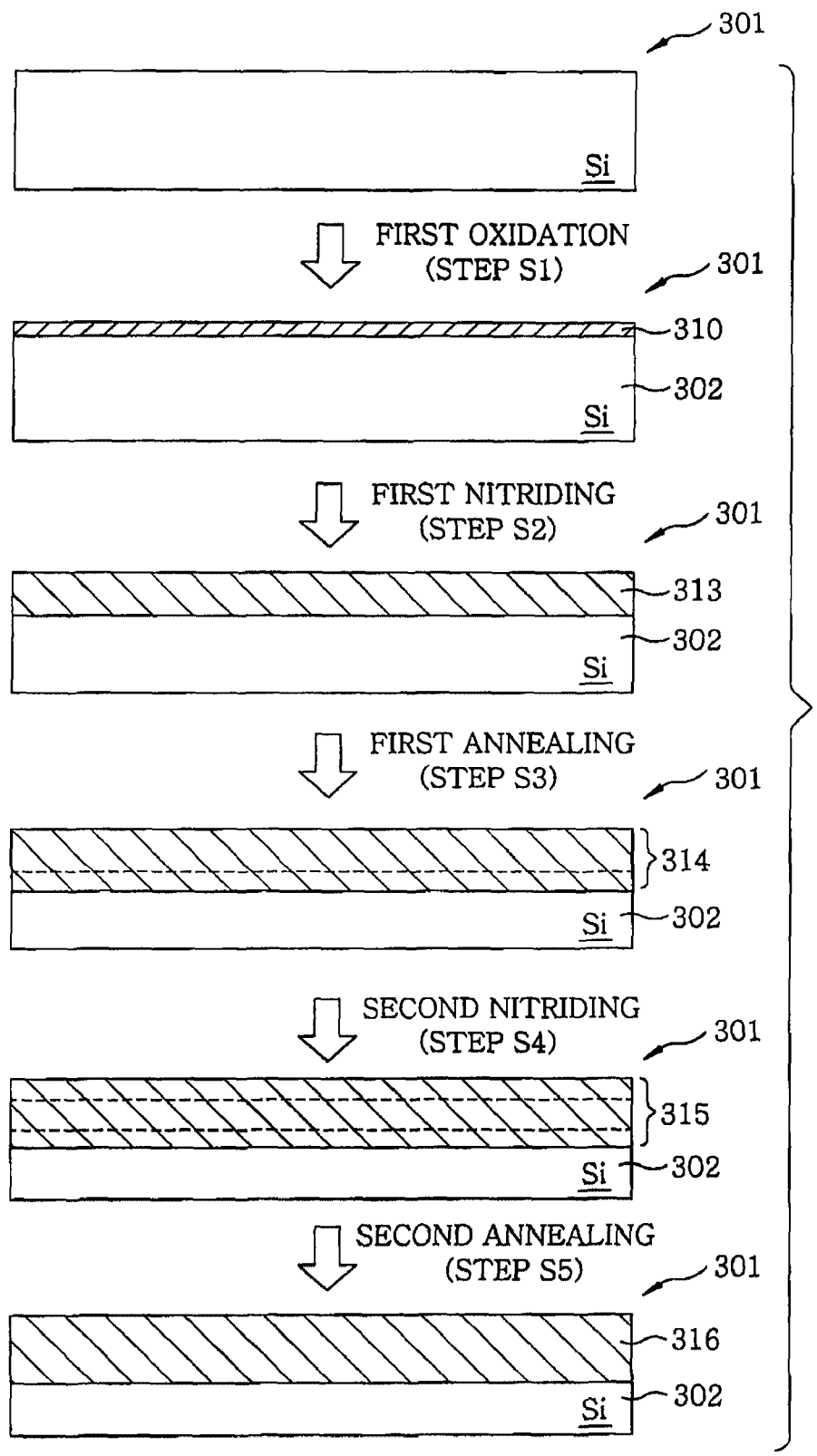
FIG. 2 is cross sectional views illustrating respective processes corresponding to steps S1 to S5 shown in FIG. 1.
Figure 3:
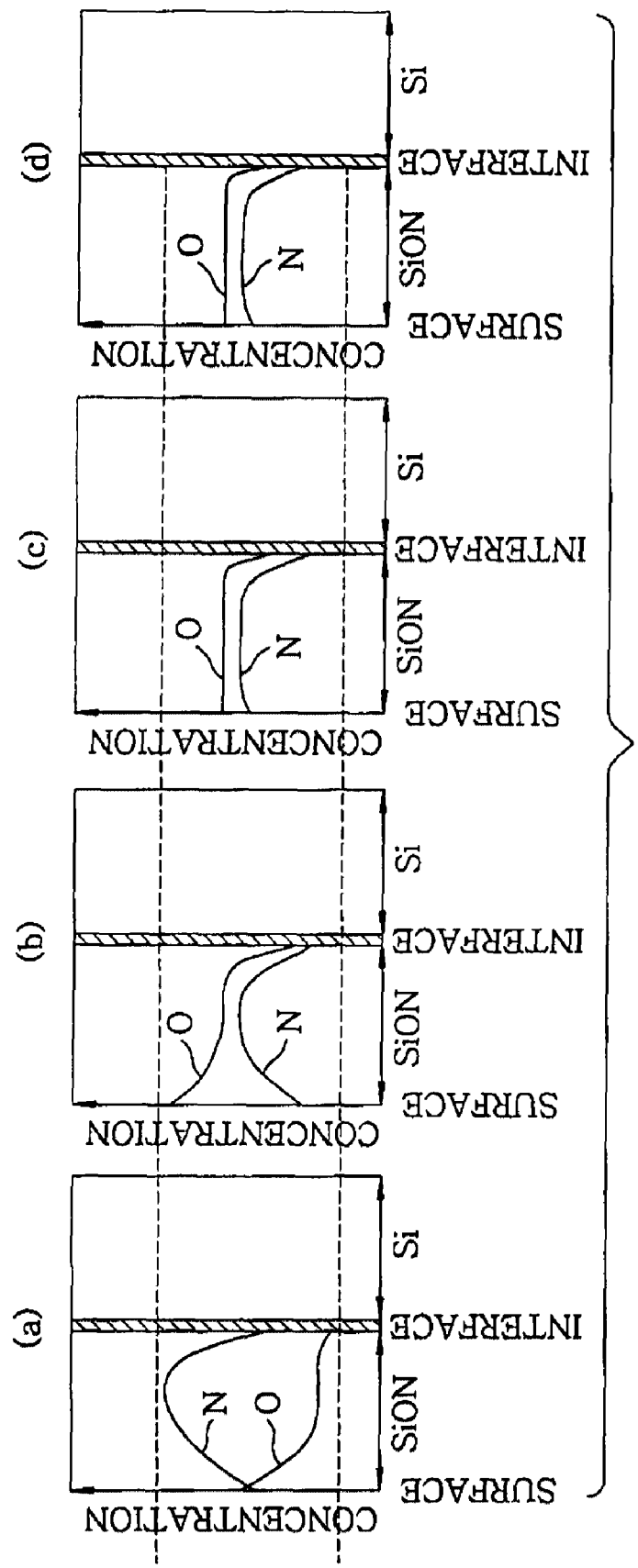
FIG. 3 illustrates profiles of nitrogen and oxygen in insulating films corresponding to the respective processes of steps S1 to S5 shown in FIG. 1.

FIG. 1 is a flow chart showing a method for forming an insulating film in accordance with an embodiment of the present invention. FIG. 2 is cross sectional views showing respective processes of step S1 to step S5 shown in FIG. 1. FIG. 3 illustrates profiles of nitrogen (N) and oxygen (O) in insulating films in the depth direction after the respective processes. Here, formation of an insulating film applicable to a gate insulating film of a transistor will be exemplarily described.

First, oxidation is performed on a silicon substrate 301 such as a semiconductor wafer (hereinafter, simply referred to as a 'wafer') (step S1: oxidation process). By the oxidation process, a silicon oxide film ($SiO_2$ film) 310 having an ultra-thin film thickness ranging from 0.2 to 1.0 nm, preferably from 0.2 to 0.7 nm, is formed on a silicon layer 302 of the silicon substrate 301. The oxidation of step S1 may be carried out by several methods, e.g., chemical surface treatment, ultraviolet ray irradiation, plasma oxidation, and rapid thermal oxidation, but it is not limited thereto.

In the chemical surface treatment, the ultra-thin silicon oxide film ($SiO_2$ film) 310 having a film thickness ranging from 0.2 to 1.0 nm, preferably from 0.2 to 0.8 nm, and more preferably from 0.2 to 0.5 nm is formed by oxidizing the silicon surface by using chemicals having an oxidizing action, selected from the group consisting of an ammonium hydroxide peroxide mixture (APM), a hydrogen chloride-hydrogen peroxide mixture (HPM), a sulfuric acid-hydrogen peroxide mixture, an acetic acid-hydrogen peroxide mixture, an ammonium sulfate-hydrogen peroxide mixture, an ammonium acetate-hydrogen peroxide mixture and a combination thereof. The chemical oxidation is carried out by using the APM of $NH_4OH:H_2O_2:H_2O=1:2:10$ at a temperature of 60° C. for 10 minutes, or is carried out by using the HPM of $HCl:H_2O_2:H_2O=1:1:5$ at a temperature of 80° C. for 10 minutes. The chemicals used in the chemical oxidation have a high purity, i.e., a low concentration of impurities, such as alkali metals, heavy metals, and organic matter, of preferably 1 ppm or less, more preferably 0.05 ppm or less. Thereby, an oxide film having few impurities without damage may be formed.

The ultraviolet ray irradiation is carried out by irradiating ultraviolet rays, for example, having a wavelength ranging from 1 to 400 nm, preferably from 1 to 300 nm, onto the silicon surface in an oxidation atmosphere. Accordingly, a dense oxide film without damage may be formed. For example, xenon lamps, mercury lamps, deuterium lamps are used as a light source to irradiate ultraviolet rays.

Figure 5:
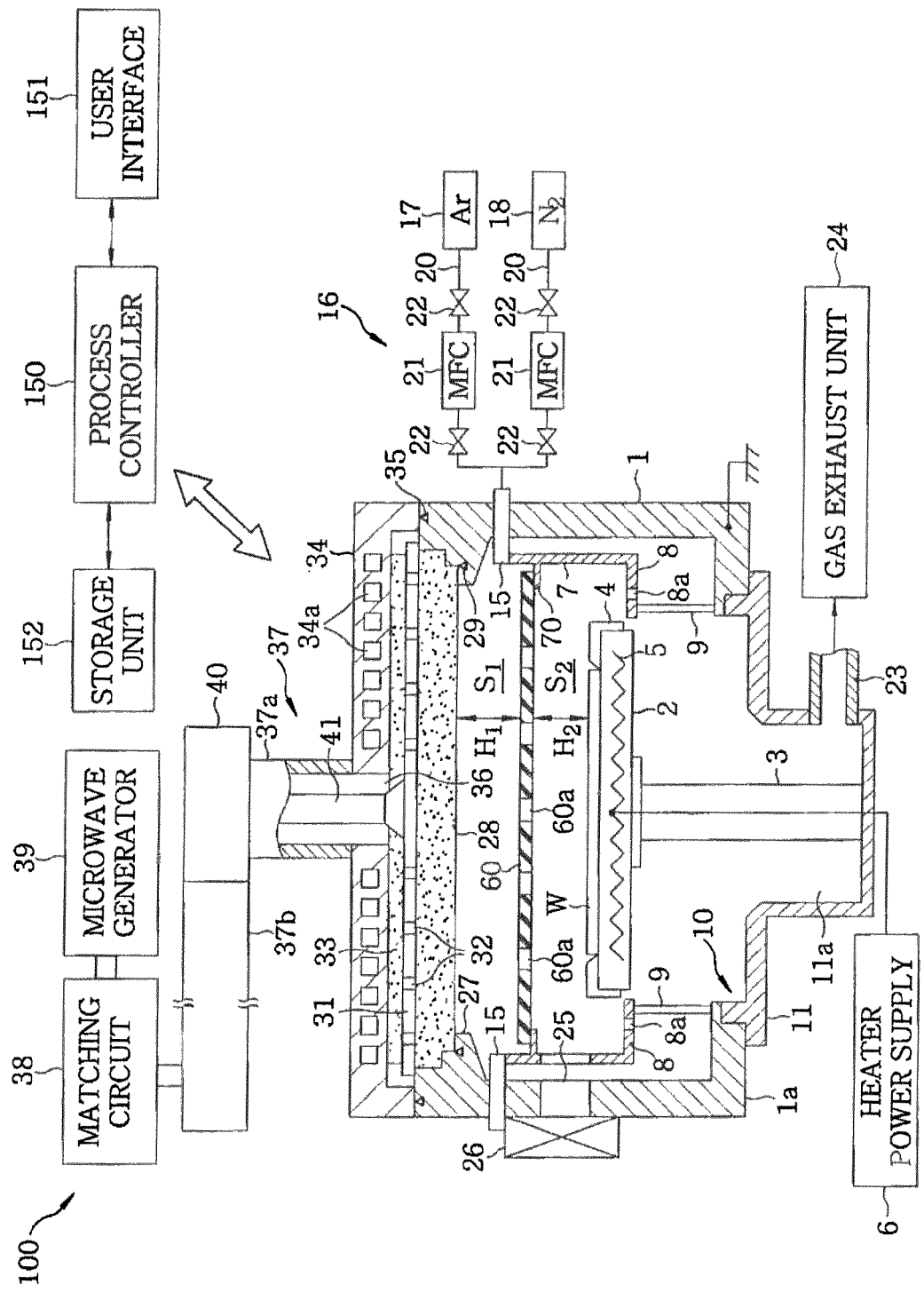
FIG. 5 schematically shows a cross sectional view of a plasma nitriding unit for performing nitriding, which is included in the substrate processing system shown in FIG. 4.

The plasma oxidation is carried out by using, e.g., a plasma processing apparatus 100, as shown in FIG. 5, which will be described later, or other plasma processing apparatuses including a plasma processing apparatus of a remote type, a plasma processing apparatus of an ICP type, a plasma processing apparatus of a surface reflected wave type, and a plasma processing apparatus of a magnetron type, under the condition that Ar gas and $O_2$ gas are used as process gases, the flow rate of Ar gas is set to range from 0 to 6,000 mL/min (sccm) and the flow rate of $O_2$ gas is set to range from 1 to 6,000 mL/min(sccm) such that the flow rate ratio of $Ar/O_2$ ranges from 1 to 1,000, an inner pressure of a chamber is adjusted to range from 0.67 to 1,333 Pa (from 5 mTorr to 10 Torr), preferably from 13.3 to 533.3 Pa (from 100 mTorr to 4 Torr), and the wafer W is heated to a temperature ranging from 300 to 800° C., preferably from 400 to 600° C., and the process time is set to range from 5 to 120 seconds. At this time, the microwave power is set to range from 1,000 to 3,000 W, preferably from 1,000 to 2,500 W. Thereby, a dense oxide film may be formed.

The rapid thermal oxidation is carried out by using, e.g., a rapid thermal processing (RTP) apparatus under the condition that the process temperature ranges from 800 to 1,100° C., the flow rate of $O_2$ gas is set to range from 2 to 10 L/min (slm), the process pressure is set to range from 133.3 to 79,980 Pa (from 1 to 600 Torr), and the process time is set to range from 10 to 50 seconds. Alternately, a thermal oxidation furnace, such as a water vapor generator (WVG), may be used. Thereby, a dense oxide film without damage may be formed.

Thereafter, nitriding is carried out on the silicon substrate 301 with the silicon oxide film 310 formed thereon (step S2: first nitriding process). The nitriding of the silicon oxide film 310 and the silicon layer 302 formed thereunder is carried out by the first nitriding process, and thus a silicon oxynitride film (SiON film) 313 having a larger thickness (greater film growth) than that of the silicon oxide film 310 is formed. The nitriding of step S2 may be carried out by several methods, e.g., thermal processing and plasma processing, but it is not limited thereto. However, it is preferable that plasma nitriding is carried out by using a plasma processing apparatus 100 (to be described later) capable of processing a target by using a plasma of a high density, a low electron temperature, and a low ion energy ranging from 0.5 to 1.5 [eV], as shown in FIG. 5, from the viewpoint of the formation of the silicon oxynitride film 313 having an ultra-thin thickness almost without plasma damage.

When the plasma nitriding is carried out by using the plasma processing apparatus, the flow rate of rare gas, e.g., Ar gas, is set to range from 100 to 6,000 mL/min(sccm), and the flow rate of $N_2$ gas is set to range from 10 to 2,000 mL/min (sccm). In this case, the flow rate ratio of Ar to $N_2$ ($Ar/N_2$) range from 0.5 to 600, preferably from 2 to 200. Further, an inner pressure of a chamber is adjusted to range from 0.66 to 1,333 Pa (from 0.0005 to 10 Torr), preferably from 66.7 to 667 Pa (from 0.5 to 5 Torr), and more preferably from 133.3 to 266.6 Pa (from 1 to 2 Torr), and the wafer W is heated to a temperature ranging from 300 to 800° C., preferably from 400 to 800° C., and more preferably from 600 to 800° C. Preferably, the microwave power is set to range from 500 to 2,000 W. Further, if a plate 60 (to be described later) is not provided, the process pressure is preferably adjusted to range from 133.3 to 1,333 Pa (1 to 10 Torr). In the first nitriding process of step S2, the nitriding is carried out under the condition that a plasma mainly containing radicals is generated. Accordingly, there is no damage to the film and the substrate.

The silicon oxynitride film may be controlled to have a desired film thickness by adjusting, the temperature, the pressure, and the microwave power among the above conditions, and may be controlled by adjusting the process time. Further, the film thickness of the silicon oxynitride film may be controlled by suppressing supply of ions by providing a plate made of, e.g., quartz in a space within the chamber, the plate having a plurality of uniformly arranged holes.

When step S2 is completed, N atoms and nitrogen atoms are introduced into the interface between the silicon oxynitride film 313 and the silicon layer 302 and oxygen atoms and nitrogen atoms are present on the interface, as shown in (a) of FIG. 3. Accordingly, flat band voltage (Vfb) in a transistor or a capacitor using this ultra-thin insulating film is limited to a small value. Thus, high transconductance (Gm) and high on current (Ion) can be obtained.

Thereafter, thermal oxidation is performed on the silicon substrate 301 having the silicon oxynitride film 313 formed thereon by using a heat treating unit 101 (to be described later), as shown in FIG. 9 (step S3: first annealing process). Consequently, the silicon oxynitride film 313 is oxidized by introducing oxygen into the silicon oxynitride film 313, thereby forming a silicon oxynitride film (SiON film) 314 having a concentration gradient in which an oxygen concentration decreases from the surface of the silicon oxynitride film 314 toward the interface between the silicon oxynitride film 314 and the silicon layer 302. The first annealing process is carried out by using a gas mixture including $N_2O$ gas and $N_2$ gas, or $N_2O$ gas. In this case, it is preferable that the flow rate of $N_2O$ gas ranges from 50 to 6,000 mL/min(sccm), the flow rate of $N_2$ gas is set to range from 0 to 3,000 mL/min (sccm), and the partial pressure of $N_2O$ gas is set to range from 3.3 to 133.3 Pa. Further, the thermal oxidation is preferably carried out at a process pressure ranging from 133.3 to 13,333 Pa and a process temperature within a range from 900 to 1,200° C. for about from 0.1 to 2 minutes. The higher the process temperature is, the more effectively the thermal oxidation is carried out. That is, the process temperature is preferably 1,000° C. or more, and more preferably between 1000 and 1,200° C.

The surface of the silicon oxynitride film 314, obtained by carrying out the thermal oxidation at a high temperature within 1,000 to 1,200° C. in an $N_2O$ gas atmosphere, is oxidized. Accordingly, as shown in (b) of FIG. 3, oxygen is entirely increased in the thickness direction, and thus a nitrogen concentration is substantially lowered. The nitrogen concentration in the film 314 shows a profile that increases in the depth direction toward the interface between the film 314 and the silicon layer 302 and that on the interface between the film 314 and the silicon layer 302 is lowered, in the same way as the profile of (a) of FIG. 3. However, the profile of the nitrogen concentration is entirely lower than the profile of (a) of FIG. 3. On the other hand, an oxygen concentration is generally decreased from the surface of the silicon oxynitride film 314 to the interface between the silicon oxynitride film 314 and the silicon layer 302, and thus has a same profile as that of (a) of FIG. 3. However, this oxygen concentration is entirely higher than the oxygen concentration of (a) of FIG. 3, and oxygen of a higher level than that of (a) of FIG. 3 is introduced into the interface. In the silicon oxynitride film 314 having these nitrogen/oxygen profiles, since nitrogen atoms are distant from the interface due to formation of Si—O at the interface, fixed charges in the insulating film and on the interface can be reduced.

That is, interface states are reduced and flat band voltage (Vfb) is suppressed by change from Si—SiN to Si—SiO. Further, a threshold voltage (Vth) shift in the transistor is improved and excellent transconductance (Gm) and excellent characteristics of the on current (Ion) are achieved.

Thereafter, the plasma nitriding is carried out only on the surface of the silicon oxynitride film (SiON film) 314 by using the plasma processing apparatus 100 (to be described later) shown in FIG. 5 (step S4: second nitriding process). By the second nitriding of step S4, nitrogen is newly introduced into the surface (up to, e.g., 0.5 nm in the depth direction) of the silicon oxynitride film 314, and a silicon oxynitride film 315 having the profile of a more uniform nitrogen concentration in the thickness direction, as shown in (c) of FIG. 3, is formed by increasing the nitrogen concentration at the surface of the silicon oxynitride film 304, compared to that obtained after step S3 has been completed (see (b) of FIG. 3). By increasing the nitrogen concentration near the surface of the film, a threshold voltage (Vth) shift in the transistor is suppressed, and the leakage current is reduced under the condition that high transconductance (Gm) and high on current (Ion) are maintained. Further, by increasing the nitrogen concentration in the film, the penetration of boron into the film is prevented, and the reliability of a semiconductor device is improved.

If the nitriding of the surface of the substrate is carried out by using the plasma processing apparatus, the flow rate of rare gas, e.g., Ar gas, is set to range from 100 to 6,000 mL/min (sccm), and the flow rate of $N_2$ gas is set to range from 5 to 2,000 mL/min(sccm). In this case, the flow rate ratio of Ar to $N_2$ (Ar/$N_2$) falls between 0.5 and 600, preferably between 2 and 200. Further, the inner pressure of the chamber is adjusted to range from 0.66 to 1,333 Pa (5 mTorr to 10 Torr), preferably from 1.33 to 26.6 Pa (5 mTorr to 0.2 Torr), and more preferably from 1.33 to 12 Pa (5 to 90 mTorr), and the wafer W is heated to a temperature between 200 and 600° C., preferably between 200 and 400° C., and more preferably between 300 and 400° C. Further, the microwave power is preferably set to fall between 500 and 2,000 W.

Further, if the plate 60 is not provided, the process pressure is preferably adjusted to be within a range from 6.6 to 26.6 Pa (0.05 to 0.2 Torr).

In the second nitriding process of step S4, the nitriding is preferably carried out under the condition that a plasma mainly containing ions is generated. This plasma preferably has a low electron temperature within a range from 0.5 to 2 [eV].

By carrying out the above processes of steps S1 to S4, nitrogen of a regular level is introduced into the silicon layer 302 in the thickness direction from the surface of the silicon substrate 301 toward the interface with the silicon layer 302, thereby forming the silicon oxynitride film 315 having a profile of the nitrogen concentration, in which the nitrogen concentration decreases in the depth direction around the interface.

Thereafter, the annealing is carried out to increase the density of the silicon oxynitride film 315 to thereby improve insulating characteristics (step S5: second annealing process). This annealing is carried out by using the heat treating unit 101 shown in FIG. 9. The annealing may be carried out in an atmosphere of $N_2$ gas, $N_2O$ gas, $O_2$ gas, or a gas mixture thereof, preferably in an atmosphere of $N_2$ gas, $O_2$ gas, or a gas mixture of $N_2$ and $O_2$. Here, it is preferable that the flow rate of $N_2$ gas, $N_2O$ gas, or $O_2$ gas ranges from 100 to 6,000 mL/min(sccm). The process pressure is preferably 66.7 Pa or more, and more preferably from 133.3 to 1,333 Pa, and the process temperature ranges from preferably 800 to 1,200° C., and more preferably from 800 to 1,000° C. The process time ranges preferably from about 0.5 to 2 minutes. After the second annealing of step S5 is completed, the profiles of nitrogen and oxygen in the depth direction in an insulating film 316 are scarcely changed, compared to the profiles of nitrogen and oxygen obtained after step S4 is completed (see (c) of FIG. 3). However, since defect portions in Si—N bonds in the insulating film are recovered by the second annealing, temporal N release is reduced, and a silicon oxynitride film, which is dense and has a good quality, is formed. In this case, if the annealing process is carried out in any one of an oxidation atmosphere and a nonreactive atmosphere under the atmospheric pressure at a temperature of about 1,000° C., the annealing is excessively achieved and oxygen and nitrogen are not controlled to have desired profiles. Therefore, the annealing process is preferably carried out under a reduced pressure ranging from 133.3 to 1,333 Pa.

By the above processes of steps S1 to S5, the insulating film 316 having the total film thickness of 2 to 3 nm, preferably 2 to 15 times the film thickness of the silicon oxide film obtained by step S1 is formed. The insulating film 316 contains nitrogen, and thus reduces an equivalent oxide thickness (EOT) even with the above film thickness. Accordingly, the insulating film 316 lowers leakage current compared with a silicon oxide film, which is inevitably thinned to reduce the equivalent oxide thickness (EOT), and thus is advantageous. The insulating film 316 has reduced fixed charges and interface states and low flat band voltage (Vfb). Thus, the insulating film 306 has excellent electrical characteristics, i.e., excellent characteristics of the on current (Ion), high transconductance (Gm), almost no threshold voltage (Vth) shift, and a low leakage current, when the insulating film 316 is used as a gate insulating film of a transistor.

Figure 4:
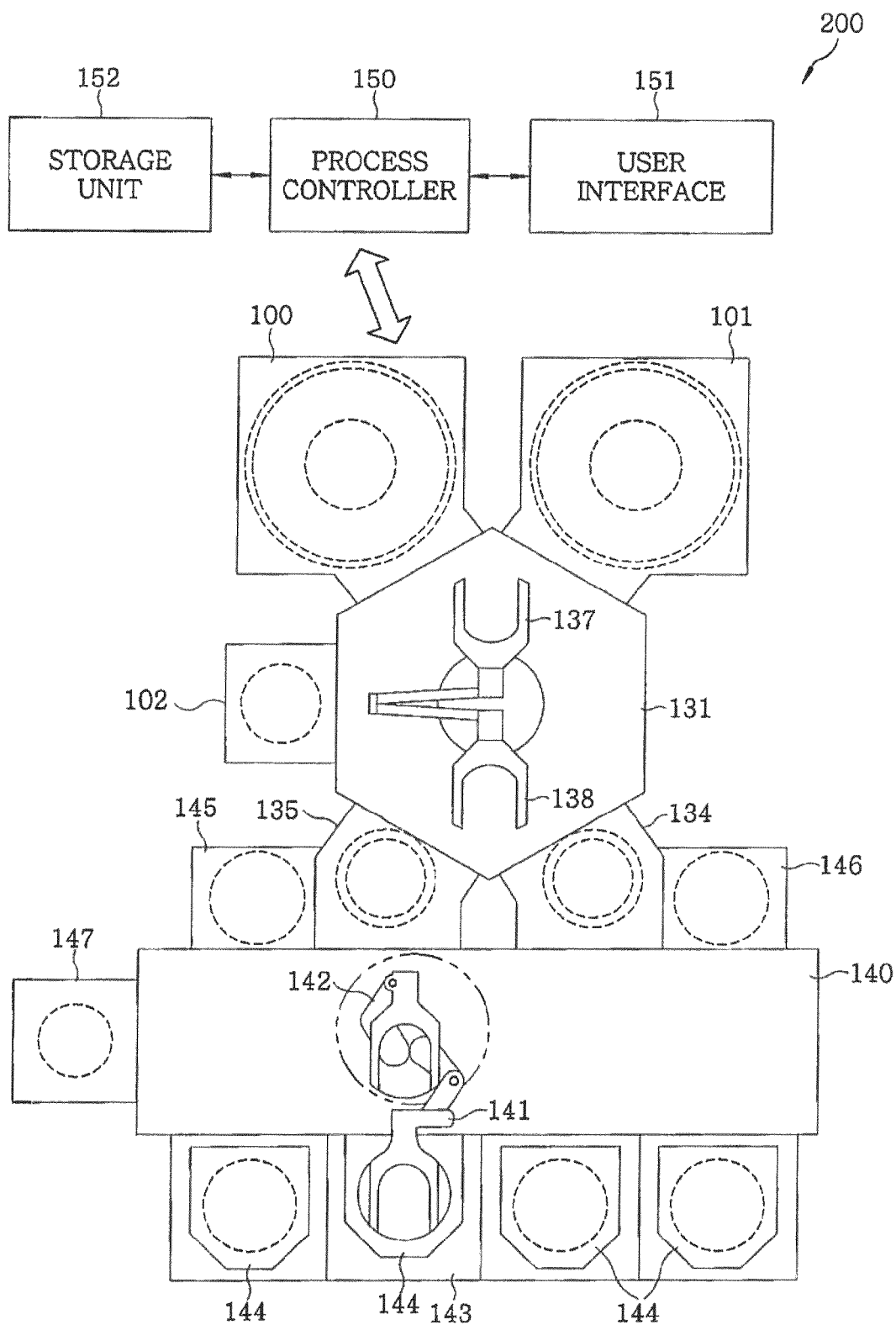
FIG. 4 schematically shows a plan view of a substrate processing system that can be properly used in the method of the present invention.

Next, a substrate processing system properly used in the gate insulating film forming method for the present invention will be described. FIG. 4 is a plan view schematically showing a configuration of the substrate processing system 200. A transfer chamber 131 is disposed approximately at the center of the substrate processing system 200 to be used to transfer the wafer W. The plasma processing apparatus 100 for performing a plasma nitriding process on the wafer W, the heat treating unit 101 for performing a thermal process including a thermal oxidation process on the wafer W, an oxidation unit 102 for performing oxidation such as chemical oxidation on the wafer W, gate valves (not shown) allowing connection/isolation of respective process chambers, and two-stage load-lock units 134 and 135 allowing transfer of the wafer W between the transfer chamber 131 and an atmospheric transfer chamber 140 are disposed to surround the transfer chamber 131.

A preliminary cooling unit 145 and a cooling unit 146 are respectively disposed at the sides of the load-lock units 135 and 134 to perform various preliminary cooling or cooling operations. Further, when the load-lock units 134 and 135 are used as cooling units, the preliminary cooling unit 145 and the cooling unit 146 may be omitted.

Transfer arms 137 and 138 are disposed in the transfer chamber 131 to be used to transfer the wafer W between the respective units.

The atmospheric transfer chamber 140 connected to the load-lock units 134 and 135 is prepared, and is provided with transfer units 141 and 142. The atmospheric transfer chamber 140 is maintained under a clean environment through downwardly flowing clean air. A cassette unit 143 is connected to the atmospheric transfer chamber 140, and the wafer W is loaded into or unloaded from four cassettes 144 set in the cassette unit 143 by using the transfer units 141 and 142. Further, an alignment chamber 147 is provided at a place close to the atmospheric transfer chamber 140, and alignment of the wafer W is carried out in the alignment chamber 147.

Further, each component of the substrate processing system 200 is controlled by using a process controller 150 including a CPU. A user interface 151, including a keyboard for inputting commands and a display for displaying an operation status of the substrate processing system 200, is connected to the process controller 150 to allow a process manager to manage the substrate processing system 200.

Further, the process controller 150 is connected to a storage unit 152 which stores recipes including control programs (software) for implementing various processes in the plasma processing apparatus 100 under control of the process controller 150, process condition data and the like.

If necessary, as a certain recipe is retrieved from the storage unit 152 in accordance with an instruction inputted through the user interface 151 and transmitted to the process controller 150, a desired process is performed in the plasma processing apparatus 100 under control of the process controller 150. Further, the recipes including control programs, process condition data and the like can be stored in and retrieved from a computer-readable storage medium such as a CD-ROM, a hard disk, a flexible disk and a flash memory, or retrieved through an on-line connected via, for example, a dedicated line to another apparatus available all the time.

FIG. 5 schematically illustrates a cross sectional view showing one example of the plasma processing apparatus 100 serving as a plasma nitriding unit in the substrate processing system 200. The plasma processing apparatus 100 is configured as an RLSA microwave plasma processing apparatus capable of generating a microwave-excited plasma of a high density and a low electron temperature by introducing a microwave into a process chamber with a planar antenna, particularly, radial line slot antenna (RLSA), having a plurality slots. In the plasma processing apparatus 100, a process can be performed by using a plasma having a plasma density ranging from $1\times10^{10}$ to $5\times10^{12}/cm^3$ and a low electron temperature ranging from 0.5 to 2 eV. Thus, the plasma processing apparatus 100 may be properly used to form a gate insulating film in the process of manufacturing various semiconductor devices, such as a metal-oxide-silicon (MOS) transistor.

Further, if the plate 60, which will be described later, is used, a plasma containing radicals having an ultra-low electron temperature ranging from 1 to 2 [eV] is generated in a first plasma region $S_1$, and a plasma containing radicals having an ultra-low electron temperature between 0.5 and 1 [eV] is generated in a second plasma region $S_2$, thereby achieving plasma processing inflicting low damage.

The plasma processing apparatus 100 includes an approximately cylindrical chamber 1, which is hermetically sealed and grounded. A circular opening 10 is formed at an approximately central portion of a bottom wall 1a of the chamber 1. A gas exhaust chamber 11, which is connected to the opening 10 and is protruded downwardly, is installed on the bottom wall 1a.

A susceptor 2 made of ceramic such as AlN is installed in the chamber 1 to horizontally support a substrate to be processed, i.e., a wafer W. The susceptor 2 is supported by a cylindrical support member 3 which is made of ceramic such as AlN and is extended upwardly from a central bottom portion of the gas exhaust chamber 11. A guide ring 4 for guiding the wafer W is installed at an outer peripheral portion of the susceptor 2. Further, a resistance heater 5 is embedded in the susceptor 2. The resistance heater 5 is supplied with power from a heater power supply 6 to heat the susceptor 2, thereby heating the wafer W. In this case, a process temperature can be controlled within a range, for example, from a room temperature to 800° C. Further, a cylindrical liner 7 made of quartz is installed at the inner periphery of the chamber 1. A baffle plate 8, which has a plurality of gas exhaust holes 8a, is installed in a ring shape at the outside of the susceptor 2 to uniformly evacuate the chamber 1. The baffle plate 8 is supported by several pillars 9.

Wafer supporting pins (not shown) are provided in the susceptor 2 to be protruded from the surface of the susceptor 2 and retracted into the susceptor 2, thereby supporting and moving the wafer W up and down.

The plate 60 is disposed above the mounting table 2 to attenuate ion energy in the plasma. By using the plate 60, when a silicon nitride film having an ultra-thin film thickness less than 1 nm is formed, controllability of the film thickness is improved. The plate 60 is made of a dielectric material of ceramic, such as quartz, sapphire, SiN, SiC, $Al_2O_3$, or AlN, polysilicon, single crystalline silicon, or amorphous silicon. Among these materials, a material having a high level of purity, such as quartz, SiN, polysilicon, single crystalline silicon, or amorphous silicon, is desirable in order to prevent metal contamination. Further, the plate 60 is supported by engagement with a support part 70, the peripheral portion of which protrudes from the liner 7 in the chamber 1 toward the inside of the chamber 1 throughout the entire circumference of the chamber 1. Further, the plate 60 may be supported by other methods.

A plate 60 is preferably installed at a position close to the wafer W, and a distance (height $H_2$) between the plate 60 and the wafer W is preferably within a range from 3 to 50 mm, and more preferably from 25 to 35 mm. In this case, a distance (height $H_1$) between the upper surface of the plate 60 and the lower surface of a transmission plate 28 (to be described later) ranges from preferably 30 to 150 mm, and more preferably from 50 to 100 mm. By disposing the plate 60 at the above position, it is possible to achieve uniform nitriding of silicon while suppressing plasma damage.

The first plasma region $S_1$ is formed in a space above the plate 60, and the second plasma region $S_2$ is formed in a space below the plate 60. Preferably, the volume of the first plasma region $S_1$ and the volume of the second plasma region $S_2$ are equal, or the volume of the second plasma region $S_2$ is smaller than the volume of the first plasma region $S_1$. A ratio ($H_1/H_2$) of the height $H_1$ of the first plasma region $S_1$ to the height $H_2$ of the second plasma region $S_2$ ranges preferably from 0.6 to 50, and more preferably from 1.4 to 4.

Figure 6:
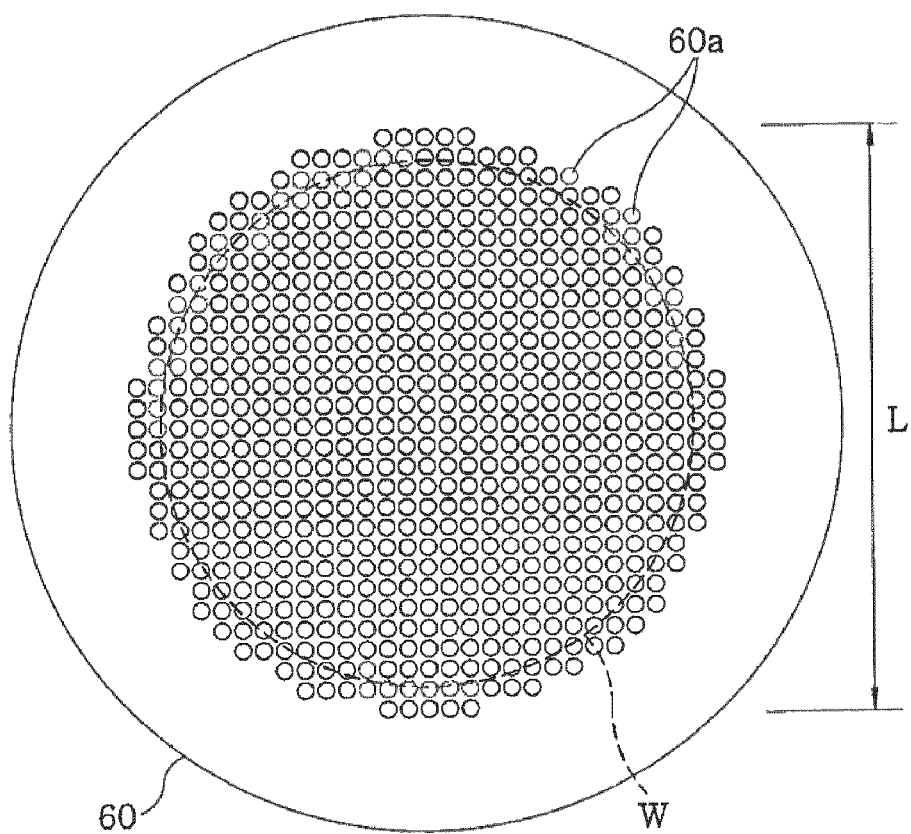
FIG. 6 is a plan view of a plate provided in the plasma nitriding unit shown in FIG. 5.
Figure 7:
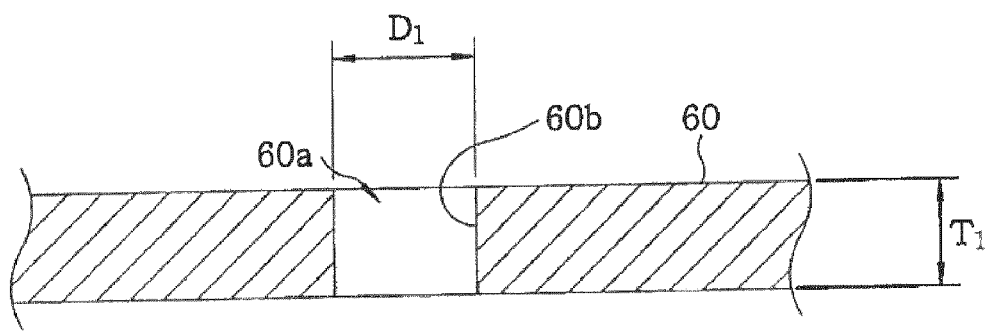
FIG. 7 is a cross sectional view illustrating an essential part of the plate provided in the plasma nitriding unit shown in FIG. 5.

Plural through holes 60a are formed through the plate 60. FIGS. 6 and 7 are detailed views of the plate 60. FIG. 6 illustrates a top view of the plate 60, and FIG. 7 illustrates a cross sectional view of an essential part of the plate 60.

The through holes 60a of the plate 60 are approximately uniformly arranged such that an arrangement region of the through holes 60a is slightly larger than a mounting region of the wafer W expressed by a dashed line in FIG. 6. Specifically, for example, in FIG. 6, the through holes 60a are arranged such that a length L corresponding the diameter of a circle passing through the outer periphery of the arrangement region of the through holes 60a is expanded outward from the outer periphery of the wafer W having a diameter of 300 mm by the pitch of the through holes 60a or more, e.g., ranging from 5 to 30 mm. Further, the through holes 60a may be arranged throughout the entire surface of the plate 60. The nitriding is uniformly carried out by arranging the through holes 60a over a wider region than the diameter of the wafer W.

The diameter $D_1$ of the through holes 60a may be set to a certain value, preferably in a range from 2 to 15 mm, and more preferably from 2.5 to 10 mm. FIG. 6 illustrates the through holes 60a having a diameter of 10 mm. The size of the through holes 60a may be varied by the position of the through holes 60a in the plate 60, and the through holes 60 may be arranged randomly, e.g., concentrically, radially, or spirally. Further, the thickness $T_1$ of the plate 60 is preferably in a range from 2 to 20 mm, and more preferably from 2 to 5 mm. By setting the diameter of the through holes 60a to the above values, sheath voltage ($V_{dc}$) on the surface of the substrate is lowered, and ion damage to the wafer is reduced, thereby achieving uniform nitriding.

The plate 60 functions as an ion energy reducing unit to reduce a total level of ion energy of plasma.

That is, the plate 60 made of a dielectric material mainly allows radicals in the plasma to pass therethrough, thereby blocking a large amount of ions. For this, it is preferable to comprehensively consider the opening area of the through holes 60a of the plate 60, the diameter $D_1$ of the through holes 60a, the shape or arrangement of the through holes 60a, the thickness $T_1$ of the plate 60 (i.e., the height of a wall 60b), the installation position of the plate 60 (i.e., the distance from the wafer W), as will be described later. For example, if the diameter of the through holes 60a is set to range from 2.5 to 10 mm, the ratio of the total opening area of the through holes 60a to the area of the wafer W in the region of the plate 60 corresponding to the wafer W (i.e., the range overlapping the wafer W) becomes preferably to fall within a range between 10 and 50%. By controlling the ratio of the total opening area of the through holes 60a to the area of the wafer W, ion energy is suppressed, and the nitriding is achieved at a low sheath voltage ($V_{dc}$) state.

Although the plasma processing apparatus 100 shown in FIG. 5 includes a single plate 60, two or more plates may be stacked, if necessary. The opening area of the through holes 60a or the ratio of the total opening area of the through holes 60a to the area of the wafer W may be properly adjusted depending on an object subjected to the plasma nitriding or the processing conditions.

A gas inlet member 15 having a ring shape is provided at a sidewall of the chamber 1. A gas supply system 16 is connected to the gas inlet member 15. The gas inlet member 15 may have a showerhead shape. For example, the gas supply system 16 includes an Ar gas supply source 17 and an $N_2$ gas supply source 18. Ar, and $N_2$ gases reaching the gas inlet member 15 via respective gas lines 20 are introduced into the chamber 1 through the gas inlet member 15. Each of the gas lines 20 is provided with a mass flow controller 21 and valves 22 located at the upstream and downstream sides of the mass flow controller 21. Further, $N_2$ gas may be replaced with other gases containing nitrogen, e.g., $NH_3$ gas, a gaseous mixture containing $N_2$ and $H_2$, hydrazine or the like, preferably, gases containing nitrogen without hydrogen, such as $N_2$ gas. Further, Ar gas may be replaced with other rare gases, such as Kr gas, Xe gas, He gas or the like.

A gas exhaust pipe 23 is connected to the side surface of the gas exhaust chamber 11, and a gas exhaust unit 24 including a high speed vacuum pump is connected to the gas exhaust pipe 23. As the gas exhaust unit 24 is operated, the gas in the chamber 1 is uniformly withdrawn to a space 11a of the gas exhaust chamber 11 and is discharged through the gas exhaust pipe 23. Accordingly, the inner pressure of the chamber 1 may be rapidly lowered down to a predetermined vacuum level of, e.g., 0.133 Pa.

At the sidewall of the chamber 1, there are provided a loading/unloading port 25 through which the wafer W is delivered between the chamber 1 and a transfer chamber (not shown) adjacent to the plasma processing apparatus 100, and a gate valve 26 for opening and closing the loading/unloading port 25.

An opening is formed at an upper portion of the chamber 1, and a support part 27 having a ring shape is installed along the circumference of the opening. A transmitting plate 28, which is made of a dielectric, e.g., ceramic such as quartz, $Al_2O_3$ or AlN, and transmits a microwave, is airtightly installed at the support part 27 through a seal member 29. Therefore, the inside of the chamber 1 can be maintained in a hermetically sealed state.

Figure 8:
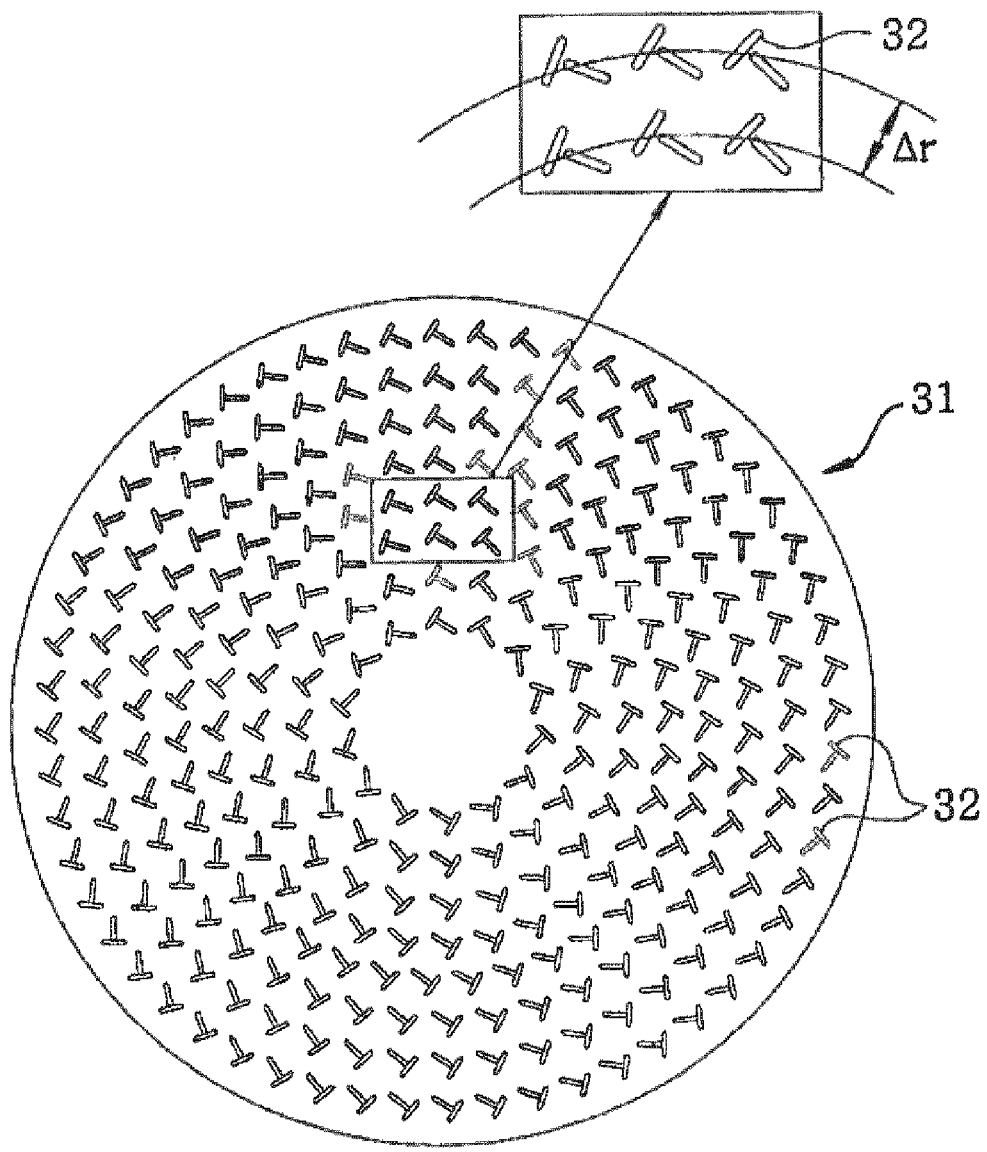
FIG. 8 is a plan view illustrating one example of a planar antenna member used in the substrate processing system shown in FIG. 4.

A planar antenna plate 31 having a circular plate shape is installed above the transmitting plate 28 to face the susceptor 2. The planar antenna plate 31 is suspended on the upper end of the sidewall of the chamber 1. The planar antenna plate 31 is made of an aluminum plate or a copper plate, the surface of which is coated with silver or gold. A plurality of slot-shaped microwave radiation holes 32 to radiate the microwave are formed in a specific pattern through the planar antenna plate 31. As shown in FIG. 8, the microwave radiation holes 32 have pairs of long slots, wherein each pair of the microwave radiation holes 32 are generally arranged in a "T" shape. The pairs of the holes are arranged in plural concentric circles. The length and arrangement interval of the holes 32 depend on the wavelength ($\lambda g$) of the microwave. For example, the holes 32 may be arranged at intervals of $\lambda g/4$, $\lambda g/2$ or $\lambda g$. In FIG. 8, an interval between the adjacent holes 32 on different concentric circles is represented by $\Delta r$. Also, the holes 32 may have a circular shape, a circular arc shape or the like. No particular limitation is imposed on the arrangement of the holes 32. For example, the holes 32 may be arranged in a spiral or radial pattern in addition to the concentric circular pattern.

A wave retardation member 33, which is made of a dielectric material having a larger dielectric constant than that of a vacuum, is installed on the upper surface of the planar antenna plate 31. Since the microwave has a longer wavelength in a vacuum, the wave retardation member 33 functions to shorten the wavelength of the microwave to control the plasma. Further, the planar antenna member 31 and the transmission plate 28 or the wave retardation member 33 and the planar antenna member 31 may be in contact with each other or be separated from each other.

A shield cover 34, which is made of metal such as aluminum, stainless steel or the like, is installed on the upper surface of the chamber 1 to cover the planar antenna plate 31 and the wave retardation member 33. The upper surface of the chamber 1 and the shield cover 34 are sealed with a seal member 35. Cooling water paths 34a are formed in the shield cover 34, and cooling water flows through the cooling water paths 34a to cool the shield cover 34, the wave retardation member 33, the planar antenna plate 31 and the transmitting plate 28. Further, the shield cover 34 is grounded.

An opening 36 is formed at the center of an upper wall of the shield cover 34, and a waveguide 37 is connected to the opening 36. A microwave generator 39 is connected to an end of the waveguide 37 via a matching circuit 38. Accordingly, a microwave generated in the microwave generator 39 and having a frequency of, e.g., 2.45 GHz propagates to the planar antenna plate 31 via the waveguide 37. Further, the microwave may have a frequency of 8.35 GHz, 1.98 GHz, or the like.

The waveguide 37 includes a coaxial waveguide 37a having a circular cross sectional shape, which is extended upwardly from the opening 36 of the shield cover 34, and a rectangular waveguide 37b, which is connected to the upper end of the coaxial waveguide 37a via a mode converter 40 and is extended in the horizontal direction. The mode converter provided between the coaxial waveguide 37a and the rectangular waveguide 37b functions to convert a microwave propagating in a TE mode through the rectangular waveguide 37b into a TEM mode microwave. An internal conductor 41 is provided at the center of the coaxial waveguide 37a, and a lower end of the internal conductor 41 is fixed to the center of the planar antenna plate 31. Accordingly, the microwave propagates radially and efficiently to the planar antenna plate 31 via the internal conductor 41 of the coaxial waveguide 37a.

The above plasma processing apparatus 100 of an RLSA type performs a plasma nitriding process on a wafer W in a following sequence.

First, the gate valve 26 is opened, and a wafer W with a silicon layer is loaded through the loading/unloading port 25 into the chamber 1, and is mounted on the mounting table 2. Then, Ar gas and $N_2$ gas from the Ar gas supply source 17 and the $N_2$ gas supply source 18 of the gas supply system 16 are supplied to the inside of the chamber 1 at designated flow rates via the gas inlet member 15. Further, the inside of the chamber 1 is adjusted to be maintained under a predetermined pressure, and the wafer W is heated to a predetermined temperature.

Thereafter, the microwave from the microwave generating device 39 is transmitted to the waveguide unit 37 through the matching circuit 38, and the microwave in the waveguide unit 37 sequentially passes through the rectangular waveguide 37b, the mode converter 40, and the coaxial waveguide 37a, and is supplied to the planar antenna member 31 through the internal conductor 41. Then, the microwave is radiated through the holes (slots) 32 of the planar antenna member 31 to the space above the wafer W in the chamber 1 via the transmission plate 28. The microwave propagates in the TE mode within the rectangular waveguide 37b, and the TE mode microwave is converted into a TEM mode microwave by the mode converter 40. The TEM mode microwave propagates within the coaxial waveguide 37a toward the planar antenna member 31. Preferably, the power of the microwave generating device 39 is set to be within a range between 0.5 and 5 kW.

An electromagnetic field is formed in the chamber 1 by the microwave radiated from the planar antenna member 31 into the chamber 1 via the transmission plate 28 to generate a plasma of Ar gas and $N_2$ gas. This microwave plasma is a plasma having a high density ranging approximately from $1 \times 10^{10}$ to $5 \times 10^{12}/cm^3$, which is obtained by radiating the microwave through the plural holes 32 of the planar antenna member 31, and a low electron temperature of about 1.5 [eV] or less around the wafer W.

The microwave plasma thus obtained causes little plasma damage to a base film due to ions. However, the plate 60 made of a dielectric is provided in the chamber 1 to divide the inside of the chamber 1 into the first plasma region $S_1$ to generate a plasma and the second plasma region $S_2$ to process the wafer W by the plasma passed through the plate 60, and thus ion energy in the second plasma region $S_2$ is drastically reduced and sheath voltage ($V_{dc}$) around the substrate is lowered. Further, the electron temperature of the plasma may be reduced to 1[eV] or less, preferably 0.7 [eV] or less, and thus plasma damage may be more reduced.

Further, N atoms may be introduced directly into the silicon oxide film by the action of active species in the plasma, mainly nitrogen radicals N*.

Next, the heat treating unit 101 in the substrate processing system 200 will be described. FIG. 9 schematically shows a cross sectional view of the heat treating unit 101. The heat treating unit 101 includes one rapid thermal processing (RTP) apparatus to carry out rapid thermal annealing (RTA) having high controllability, and may be used in thermal oxidation or annealing of a thin film formed on a wafer W in a high-temperature region ranging from 800 to 1,200° C.

Further, a batch type heat treating unit may be used as the heat treating unit 101 such that plural substrates are simultaneously processed.

In FIG. 9, reference numeral 71 represents a cylindrical process chamber, and a lower heating unit 72 is detachably mounted on the lower surface of the process chamber 71. Further, an upper heating unit 74 arranged to face the lower heating unit 72 is detachably mounted on the upper surface of the process chamber 71. The lower heating unit 72 includes a water cooling jacket 73, in which water cooling channels, not shown, are formed, and a plurality of tungsten lamps 76, serving as heating members, arranged on the upper surface of the water cooling jacket 73. As in the lower heating unit 72, the upper heating unit 74 includes a water cooling jacket 75, in which water cooling channels, not shown, are formed, and a plurality of tungsten lamps 76, serving as heating members, arranged on the lower surface of the water cooling jacket 75. Further, the heating members are not limited to the tungsten lamps 76, but halogen lamps, Xe lamps, mercury lamps, or flash lamps may be used. The respective tungsten lamps 76 disposed opposite to each other in the process chamber 71 are connected to a power supply unit, which is not shown in the drawing, and a controller (the process controller 150) to control a power supply amount from the power supply unit, and the heat discharge rate of the tungsten lamps 76 is controlled thereby.

A support part 77 to support the wafer W is provided between the lower heating unit 72 and the upper heating unit 74. The support part 77 includes wafer support pins 77a to support the wafer W under the condition that the wafer W is held in the processing space within the process chamber 71, and a liner installation part 77b to support a hot liner 78 to measure the temperature of the wafer W during the process. Further, the support part 77 is connected to a rotating mechanism (not shown), and thus is rotated around a vertical axis. Thereby, the wafer W is rotated at a designated speed during the process, and thermal processing is uniformly achieved.

A pyrometer 81 is disposed below the chamber 71. The temperature of the wafer W is indirectly obtained by measuring the temperature of a heat ray from the hot liner 78 with the pyrometer 81 via a pot 81a and an optical fiber 81b during the thermal processing. Further, the temperature of the wafer W may be directly measured.

A quartz member 79 is interposed between the hot liner 78 and the tungsten lamps 76 of the lower heating unit 72, and the pot 81a is provided on the quartz member 79, as shown in FIG. 9. Further, a plurality of pots may be disposed.

Further, a quartz member 80a is interposed between the upper surface of the wafer W and the tungsten lamps 76 of the upper heating unit 74. A quartz member 80b is provided on the inner peripheral surface of the chamber 71 to surround the wafer W.

Lifter pins (not shown) to support and raise/lower the wafer W are provided such that the lifter pins pass through the hot liner 78, and are used to load and unload the wafer W.

Seal members (not shown) are respectively interposed between the lower heating unit 72 and the process chamber 71 and between the upper heating unit 74 and the process chamber 71, and thus the process chamber 71 is hermetically sealed.

A gas supply source 83 connected to a gas introduction pipe 82 is provided at the side of the process chamber 71, and serves to introduce gases, for example, $N_2O$ gas, $O_2$ gas, and Ar gas, into the processing space of the process chamber 71. Further, a gas exhaust pipe 84 is provided at the lower portion of the process chamber 71, and decompresses the inside of the process chamber 71 through an exhaust device, which is not shown.

In the above-described heat treating unit 101, the wafer W is set on the wafer support part 77 in the process chamber 71, and then the space in the process chamber 71 is hermetically sealed. Thereafter, when a designated power is supplied from the power supply unit, not shown, to the respective tungsten lamps 76 of the lower heating unit 72 and the upper heating unit 74 to turn on the tungsten lamps 76 under the control of the process controller 150, the respective tungsten lamps 76 generate heat, the generated heat reaches the wafer W through the quartz member 79 and the quartz member 80a, and the upper and lower parts of wafer W are rapidly heated under the conditions (a heating rate, a heating temperature, etc.) based on a recipe. The inside of the chamber 71 is maintained under a decompressed state by carrying out the exhaust of the chamber 71 through the gas exhaust pipe 84 by operating the exhaust device, not shown, while heating the wafer W.

During the thermal processing, the wafer W is rotated by the rotation of the support part 77 around the vertical axis at a designated speed with the rotating mechanism, not shown. Accordingly, uniformity in the amount of heat supplied to the wafer W is obtained.

Further, the temperature of the wafer W is indirectly obtained by measuring the temperature of the hot liner 78 with the pyrometer 81 during the thermal processing. The temperature data obtained by the pyrometer 81 is fed back to the process controller 150, and if there is a difference between the obtained temperature and the predetermined temperature in the recipe, the supply of the power to the tungsten lamps 76 is adjusted.

After the thermal processing has been completed, the tungsten lamps 76 of the lower heating unit 72 and the upper heating unit 74 are turned off. The gases in the process chamber 71 are exhausted through the gas exhaust pipe 84 to cool the wafer, while supplying purge gas, such as nitrogen, from a purge pot, not shown, to the inside of the process chamber 71. Thereafter, the cooled wafer W is unloaded from the process chamber 71.

The above-described substrate processing system 200 carries out a series of the processes of steps S1 to S3, preferably steps S1 to S4, and more preferably steps S1 to S5, as shown in FIG. 1, and thus forms an insulating film of good quality (the silicon oxynitride film 306) on the surface of silicon, such as single crystalline silicon, polycrystalline silicon, or amorphous silicon.

That is, the transfer unit 141 or 142 of the atmospheric transfer chamber 140 receives a wafer W from any one of the cassettes 144 on the cassette unit 143, and loads the wafer W into any one of the load-lock units 134 and 135. Thereafter, the inside of the load-lock unit 134 or 135 is decompressed, and the wafer W is unloaded from the load-lock unit 134 or 135 by using the transfer arm 137 or 138 of the transfer chamber 131 and is loaded into the oxidation unit 102. Then, the oxidation process of step S1 is carried out under the above processing conditions.

After the oxidation process is completed, the wafer W is loaded into the plasma processing apparatus 100 by using the transfer arm 137 or 138 of the transfer chamber 131, and the first nitriding process of step S2 is carried out under the above processing conditions. After the first nitriding process is completed, the wafer W is unloaded from the plasma processing apparatus 100 by using the transfer arm 137 or 138 and, then, is loaded into the heat treating unit 101. In the heat treating unit 101, the first annealing process of step S3 is carried out on the wafer W under the above processing conditions.

After the first annealing process is completed, the processes of steps S4 and S5 may be continuously carried out. In this case, the wafer W is unloaded from the heat treating unit 101 and is loaded again into the plasma processing apparatus 100 by using the transfer arm 137 or 138. Then, the second nitriding process of step S4 is carried out in the plasma processing apparatus 100 under the above processing conditions. After the second nitriding process is completed, the wafer W is unloaded from the plasma processing apparatus 100 and is loaded again into the heat treating unit 101 by using the transfer arm 137 or 138, and the second annealing process of step S5 is carried out under the above processing conditions.

After all the processes are completed, the wafer W is unloaded from the heat treating unit 101 and is loaded into any one of the load-lock units 134 and 135 by the transfer arm 137 or 138. Thereafter, the inside of the load-lock unit 134 or 135 is restored back to the atmospheric pressure, and the wafer W is unloaded from the load-lock unit 134 or 135 and is returned to any one of the cassettes 144 on the cassette unit 143 by the transfer unit 141 or 142 of the atmospheric chamber 140. By the above procedure, a series of the processes on one wafer W is completed. The wafer W is processed in a vacuum without exposure to the atmosphere by the above system, and thus an insulating film may be formed on the wafer W without contaminating the wafer with organic matters.

Figure 10A:
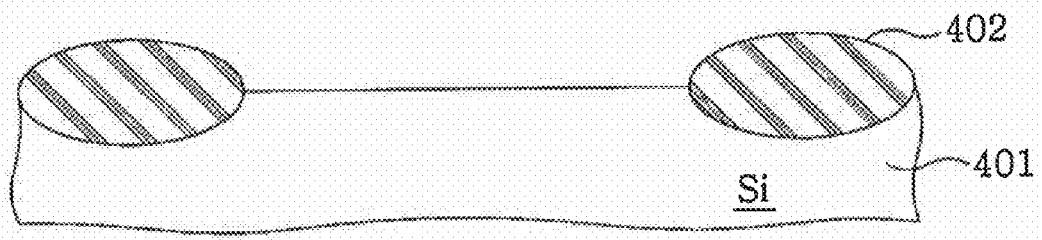
FIG. 10A illustrates a cross sectional view showing formation of a device isolation layer in a transistor manufacturing process, to which the insulating film forming method of the present invention is applied.
Figure 10B:
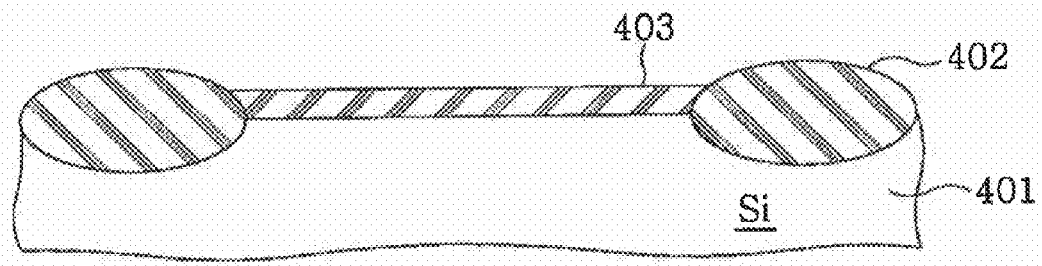
FIG. 10B illustrates a cross sectional view showing formation of an insulating film in the transistor manufacturing process, to which the insulating film forming method of the present invention is applied.
Figure 10C:
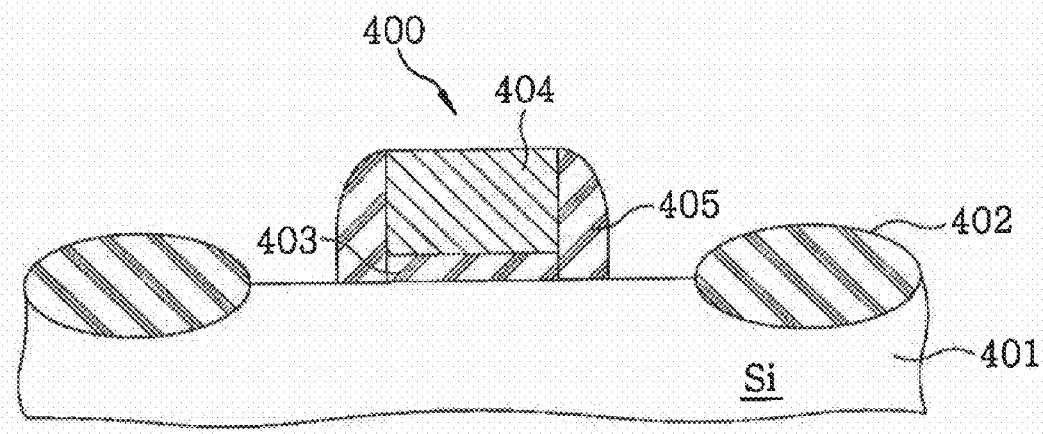
FIG. 10C illustrates a cross sectional view showing formation of a transistor in the transistor manufacturing process, to which the insulating film forming method of the present invention is applied.

The insulating film (the silicon oxynitride film 316) obtained by the above procedure may be used as a gate insulating film in manufacture of various semiconductor devices, e.g., a transistor. Particularly, the above insulating film is valuably used as a thin film in a new generation of devices, for example, a gate insulating film having a film thickness of 1 nm or less, preferably between 0.5 and 1 nm. FIGS. 10A to 10C are views illustrating an application example of the insulating film forming method of the present invention to a manufacturing process of a transistor.

As shown in FIG. 10A, a well (not shown) is formed on a P-type or N-type silicon substrate 401, and a device isolation layer 402 is formed, for example, by a LOCOS method. Further, the device isolation layer 402 may be formed by a shallow trench isolation (STI) process.

Thereafter, as shown in FIG. 10B, a gate insulating film 403 is formed on the surface of the silicon substrate 401 in accordance with the procedure of steps S1 to S5 shown in FIG. 1. The film thickness of the gate insulating film 403 is varied depending on a device to be manufactured, and ranges preferably between 0.5 and 1 nm.

A gate electrode is formed by forming a polysilicon layer 404 on the gate insulating film 403 by chemical vapor deposition (CVD), for example, at a temperature exceeding 400° C. and etching the polysilicon layer 404 by using a mask with a pattern formed by a photolithography technique. Further, the structure of the gate electrode is not limited to a single layer of the polysilicon layer 404, but may be a polycide structure forming silicide, e.g., tungsten, molybdenum, tantalum, titanium, cobalt or nickel, in order to lower resistivity of the gate electrode to obtain a high speed of a device. After the formation of the gate electrode, ion implantation and activation are carried out to form a source/drain (not shown), and a sidewall 405 is formed by an insulating film made of $SiO_2$ or SiN. Thereby, a transistor 400 of a MOS structure is manufactured, as shown in FIG. 10C.

Hereinafter, test results to confirm effects of the present invention will be described.

Test Examples

First, the surfaces of single crystalline silicon of wafers W were processed with 1% dilute hydrofluoric acid (DHF) for 45 seconds. Thereafter, silicon oxide films ($SiO_2$ films) having a film thickness of 0.8 nm were formed by chemically oxidizing the silicon surfaces through the APM treatment and the HPM treatment. The APM treatment was carried out by using chemicals of $NH_4OH:H_2O_2:H_2O=1:2:10$ at a temperature of 60° C. for 10 minutes. Further, the HPM treatment was carried out by using chemicals of $HCl:H_2O_2:H_2O=1:1:5$ at a temperature of 80° C. for 10 minutes.

Comparison Examples

The surfaces of single crystalline silicon of wafers W were processed with 1% dilute hydrofluoric acid (DHF) for 45 seconds, and natural oxide films were respectively removed from the silicon surfaces of the wafers W. Thereby, samples of the comparison examples were prepared.

Thereafter, silicon oxynitride films (SiON films) were formed by carrying out nitriding of the silicon oxide films of the wafers of samples of the test examples by using the plasma processing apparatus 100 shown in FIG. 5. As conditions of the plasma processing, Ar gas and $N_2$ gas were used as process gases, the flow rates of Ar and $N_2$ were 1,000 mL/min(sccm) and 200 mL/min(sccm), the temperature of the wafers W was 400° C., the process pressure was 11.9 Pa (90 mTorr), the microwave power was 1.5 kW, and the process time was 36 seconds. In the plasma processing apparatus 100, the plate 60 including the through holes 60*a* respectively having diameters of 10 mm was used.

Further, silicon nitride films (SiN films) were formed by carrying out nitriding of the silicon surfaces of the wafers W of samples of the comparative examples under the same conditions as the samples of the test examples, except that the process pressure was 199.9 Pa (1,500 mTorr).

Thereafter, thermal oxidation of the wafers W of the samples of the test examples, on which the silicon oxynitride films (SiON films) were respectively formed, and the wafers W of the samples of the comparative examples, on which the silicon nitride films (SiN films) were respectively formed, was carried out. The thermal oxidation was carried out under conditions, stated below.

Test Example 1 and Comparative Example 1

The flow rate of $N_2O$ gas serving as a process gas was 2 L/min(slm), the wafer temperature was 1,100° C., and the process pressure was 266.6 Pa (2 Torr).

Test Example 2 and Comparative Example 2

The flow rate of $N_2O$ gas serving as a process gas was 2 L/min(slm), the wafer temperature was 1,100° C., and the process pressure was 133.3 Pa (1 Torr).

Test Example 3 and Comparative Example 3

The flow rates of $N_2$ gas and $N_2O$ gas serving as process gases were 1.7 L/min(slm) and 0.3 L/min(slm), the wafer temperature was 1,100° C., and the process pressure was 133.3 Pa (1 Torr) (the partial pressure of the $N_2O$ was 39.9 Pa (300 mTorr).

NMOS transistors were manufactured respectively by using the silicon oxynitride films (SiON films), obtained under the above conditions, as gate insulating films, and the maximum values ($Gm_{max}$) of transconductances (Gm) and flat band voltages (Vfb) of the transistors, and gate leakage currents (Jg) of the transistors at a gate voltage of +1.1 V were measured.

Figure 11:
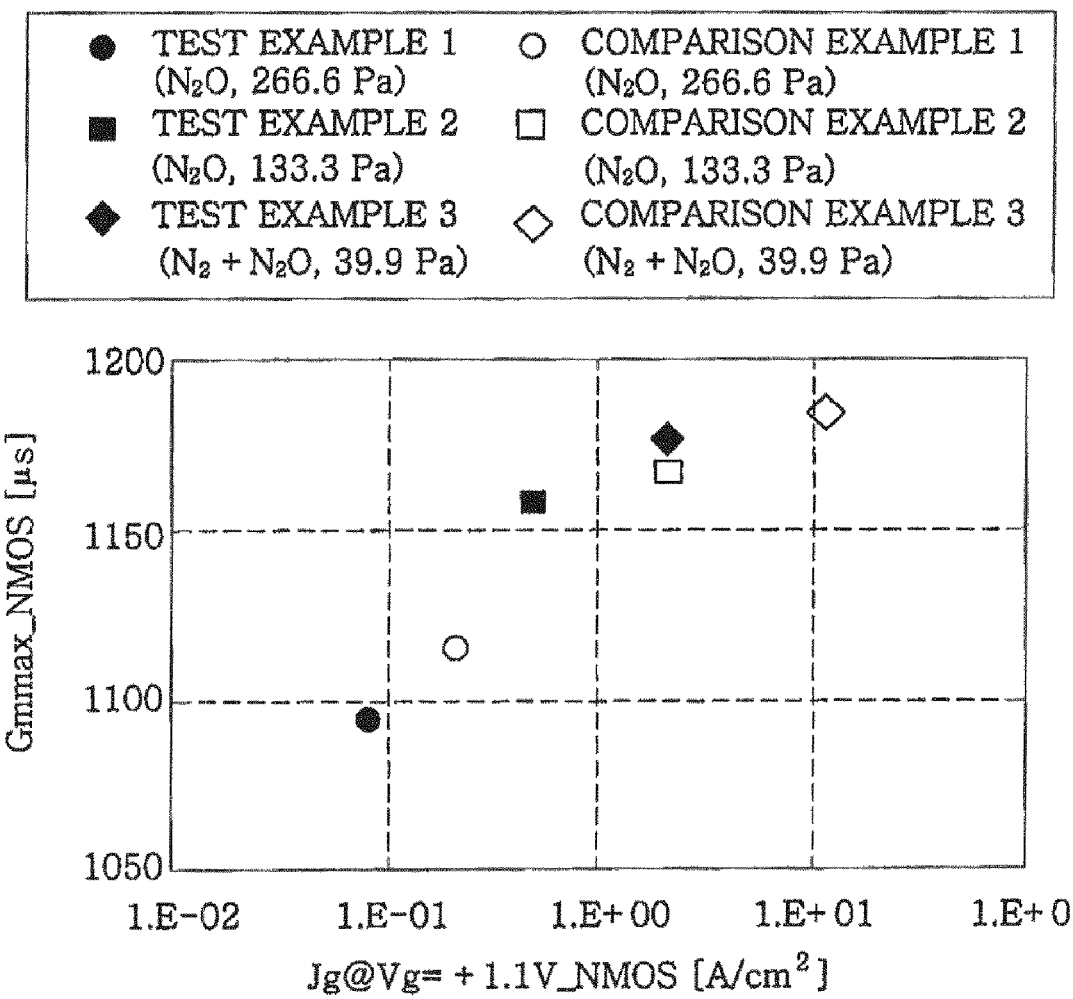
FIG. 11 is a graph illustrating a relationship between gate leakage currents (Jg) and the maximum values ($Gm_{max}$) of transconductances of silicon nitride films.

FIG. 11 illustrates a relationship between gate leakage currents (Jg) and the maximum values ($Gm_{max}$) of transconductances, and FIG. 12 illustrates a relationship between gate leakage currents (Jg) and flat band voltages (Vfb).

From FIGS. 11 and 12, it is confirmed that the samples of the test examples 1 to 3 have the high maximum values ($Gm_{max}$) of transconductances and the low resolute values of flat band voltages (Vfb), compared with the samples of the comparative examples 1 to 3, at the same level of the gate leakage currents (Jg). It is appreciated that by forming an ultra-thin silicon oxide film on the silicon surface by the chemical surface treatment prior to formation of a silicon nitride film on the silicon surface, an oxygen concentration at the silicon interface maintains a high level and nitrogen is introduced into the interface, and thus interface states are lowered and flat band voltage (Vfb) is suppressed.

A high-k dielectric oxide film, made of at least one of $Al_2O_3$, HfSiO, $HfO_2$, $ZrO_2$, ZrSiO, RuO, $PrO_2$, and $DyO_2$, is formed on an insulating film made of the silicon oxynitride film, and thus it is possible to lower an equivalent oxide thickness (EOT) and reduce leakage current. Thereby, a gate insulating film of high reliability can be formed.

Further, the above embodiment of the present invention may be variously modified. Although the exemplary embodiment of the present invention has been disclosed for illustrative purposes, those skilled in the art will appreciate that various modifications, additions and substitutions are possible, without departing from the scope and spirit of the invention as disclosed in the accompanying claims.

For example, although the above embodiment uses the plasma processing apparatus 100 of an RLSA type in the first nitriding process (step S2), other plasma processing apparatuses, e.g., a plasma processing apparatus of a remote type, a plasma processing apparatus of an ICP type, a plasma processing apparatus of an ECR type, a plasma processing apparatus of a surface reflected wave type, a plasma processing apparatus of a CCP type, and a plasma processing apparatus of a magnetron type, or plasma processing apparatuses obtained by disposing a plate having the same configuration as that of the plate 60 in the above apparatuses may be used.

INDUSTRIAL APPLICABILITY

The embodiment of the present invention is properly applied to the formation of a silicon nitride film by carrying out nitriding of silicon in the manufacture of various semiconductor devices.

What is claimed is:

1. A method for forming an insulating film, comprising:
preparing a substrate to be processed, in which silicon is exposed on a surface of the substrate;
performing an oxidation process on the silicon to form a thin silicon oxide film on a surface of the silicon;
performing a first nitriding process on the silicon oxide film and the silicon provided under the silicon oxide film to form a silicon oxynitride film;
performing a first thermal process on the silicon oxynitride film in an $N_2O$ or $N_2O$ and $N_2$ atmosphere; and
performing a second nitriding process on the silicon oxynitride film after the first thermal process is performed,
wherein the first thermal process is performed at a temperature ranging from 900 to 1,200° C. and a process pressure ranging from 133.3 to 1333 Pa, and
wherein the first nitriding process is performed by using a plasma of rare gas and gas containing nitrogen.

2. The method of claim 1, further comprising:
performing a second thermal process on the silicon oxynitride film, after the second nitriding process is performed.

3. The method of claim 2, wherein the second thermal process is performed in an atmosphere containing $N_2O$, $N_2$, $O_2$ gas or a combination thereof.

4. The method of claim 3, wherein the second thermal process is performed at a process pressure ranging from 133.3 to 1,333 Pa and a process temperature ranging from 800 to 1,200° C.

5. The method of claim 1, wherein in the oxidation process of the silicon, the silicon oxide film having a film thickness ranging from 0.2 to 1 nm is formed.

6. The method of claim 5, wherein the oxidation process of the silicon is performed by using any one method of chemical surface treatment, ultraviolet ray irradiation, plasma oxidation, and rapid thermal oxidation.

7. The method of claim 6, wherein in the chemical surface treatment, the silicon oxide film having a film thickness ranging from 0.2 to 0.8 nm is formed.

8. The method of claim 1, wherein the second nitriding process is performed by using a plasma of rare gas and gas containing nitrogen.

9. The method of claim 1, wherein the first nitriding process is performed by using a plasma containing nitrogen formed by introducing a microwave into a process chamber through a planar antenna having a plurality of slots.

10. The method of claim 9, wherein the first nitriding process is performed by interposing a dielectric plate having a plurality of through holes between the substrate placed in the process chamber and a plasma generating region.

11. The method of claim 1, wherein the second nitriding process is performed by using a plasma containing nitrogen formed by introducing a microwave into a process chamber through a planar antenna having a plurality of slots.

12. The method of claim 11, wherein the second nitriding process is performed by interposing a dielectric plate having a plurality of through holes between the substrate placed in the process chamber and a plasma generating region.

13. The method of claim 1, further comprising:
performing a surface activation process on the substrate with a solution containing dilute hydrofluoric acid, before the oxidation process of the silicon is performed.

14. A method of manufacturing a semiconductor device, comprising:
forming an insulating film including preparing a substrate to be processed, in which silicon is exposed on a surface of the substrate, performing an oxidation process on the silicon to form a thin silicon oxide film on a surface of the silicon, performing a nitriding process on the silicon oxide film and the silicon provided under the silicon oxide film to form a silicon oxynitride film, performing a thermal process on the silicon oxynitride film in an $N_2O$ or $N_2O$ and $N_2$ atmosphere, and performing an additional nitriding process on the silicon oxynitride film after the thermal process is performed; and
forming semiconductor device elements on the substrate,
wherein the thermal process is performed at a temperature ranging from 900 to 1,200° C. and a process pressure ranging from 133.3 to 1333 Pa, and
wherein the nitriding process is performed by using a plasma of rare gas and gas containing nitrogen.

* * * * *